(12) United States Patent
Lee (10) Patent No.: US 7,915,636 B2
(45) Date of Patent: Mar. 29, 2011

(54) III-NITRIDE SEMICONDUCTOR LIGHT EMITTING DEVICE

(75) Inventor: Chang Myung Lee, Gyeonggi-do (KR)

(73) Assignee: Epivalley Co., Ltd., Gumi, Gyungbuk (KR)

( * ) Notice: Subject to any disclaimer, the term of this patent is extended or adjusted under 35 U.S.C. 154(b) by 457 days.

(21) Appl. No.: 12/195,635

(22) Filed: Aug. 21, 2008

(65) Prior Publication Data

US 2009/0152578 A1   Jun. 18, 2009

(30) Foreign Application Priority Data

Dec. 17, 2007   (KR) ................ 10-2007-0132279

(51) Int. Cl.
*H01L 33/00* (2010.01)

(52) U.S. Cl. ............... 257/103; 257/94; 257/96; 257/97; 257/E33.008; 257/E21.121; 257/E21.125; 257/E21.127

(58) Field of Classification Search .......... 257/103, 257/94, 97, 96, E21.121, E21.125, E21.127, 257/E33.008
See application file for complete search history.

(56) References Cited

U.S. PATENT DOCUMENTS

| | | | |
|---|---|---|---|
| 3,739,217 A | 6/1973 | Bergh et al. | |
| 5,122,845 A | 6/1992 | Manabe et al. | |
| 5,247,533 A | 9/1993 | Okazaki et al. | |
| 5,290,393 A | 3/1994 | Nakamura | |
| 5,306,662 A | 4/1994 | Nakamura et al. | |
| 5,563,422 A | 10/1996 | Nakamura et al. | |
| 5,733,796 A | 3/1998 | Manabe et al. | |
| 6,091,085 A | 7/2000 | Lester | |
| 6,163,037 A * | 12/2000 | Matsumoto et al. | 257/101 |
| 6,194,743 B1 | 2/2001 | Kondoh et al. | |
| 6,242,764 B1 * | 6/2001 | Ohba et al. | 257/190 |
| 6,441,403 B1 | 8/2002 | Chang et al. | |
| 6,515,306 B2 | 2/2003 | Kuo et al. | |
| 6,657,236 B1 | 12/2003 | Thibeault et al. | |

FOREIGN PATENT DOCUMENTS

| | | |
|---|---|---|
| WO | 2005/022655 | 3/2005 |
| WO | 2005/053042 | 6/2005 |

* cited by examiner

*Primary Examiner* — Long K Tran (74) *Attorney, Agent, or Firm* — Harness, Dickey & Pierce, P.L.C.

(57) ABSTRACT

The present disclosure relates to a III-nitride semiconductor light emitting device which improves external quantum efficiency by using a p-type nitride semiconductor layer with a rough surface, the p-type nitride semiconductor layer including: a first nitride semiconductor layer with a first doping concentration, a second nitride semiconductor layer with a second doping concentration lower than the first doping concentration and with the rough surface, and a third nitride semiconductor layer with a higher doping concentration than a second doping concentration.

11 Claims, 8 Drawing Sheets

FIG. 1

Prior Art

FIG. 2

Prior Art

FIG. 3

Prior Art

III-NITRIDE SEMICONDUCTOR LIGHT EMITTING DEVICE

CROSS-REFERENCE TO RELATED APPLICATIONS

This application claims the benefit of Korean Patent Application No. 10-2007-0132279 filed Dec. 17, 2007. The entire disclosure of the above application is hereby incorporated by reference.

FIELD

The present disclosure relates to a III-nitride semiconductor light emitting device, and more particularly, to a III-nitride semiconductor light emitting device which improves external quantum efficiency by using a p-type nitride semiconductor layer with a rough surface. The III-nitride semiconductor light emitting device means a light emitting device such as a light emitting diode including a compound semiconductor layer composed of $Al_{(x)}Ga_{(y)}In_{(1-x-y)}N$ ($0 \leq x \leq 1$, $0 \leq y \leq 1$, $0 \leq x+y \leq 1$), and may further include a material composed of other group elements, such as SiC, SiN, SiCN and CN, and a semiconductor layer made of such materials.

BACKGROUND

This section provides background information related to the present disclosure which is not necessarily prior art.

Figure 1:
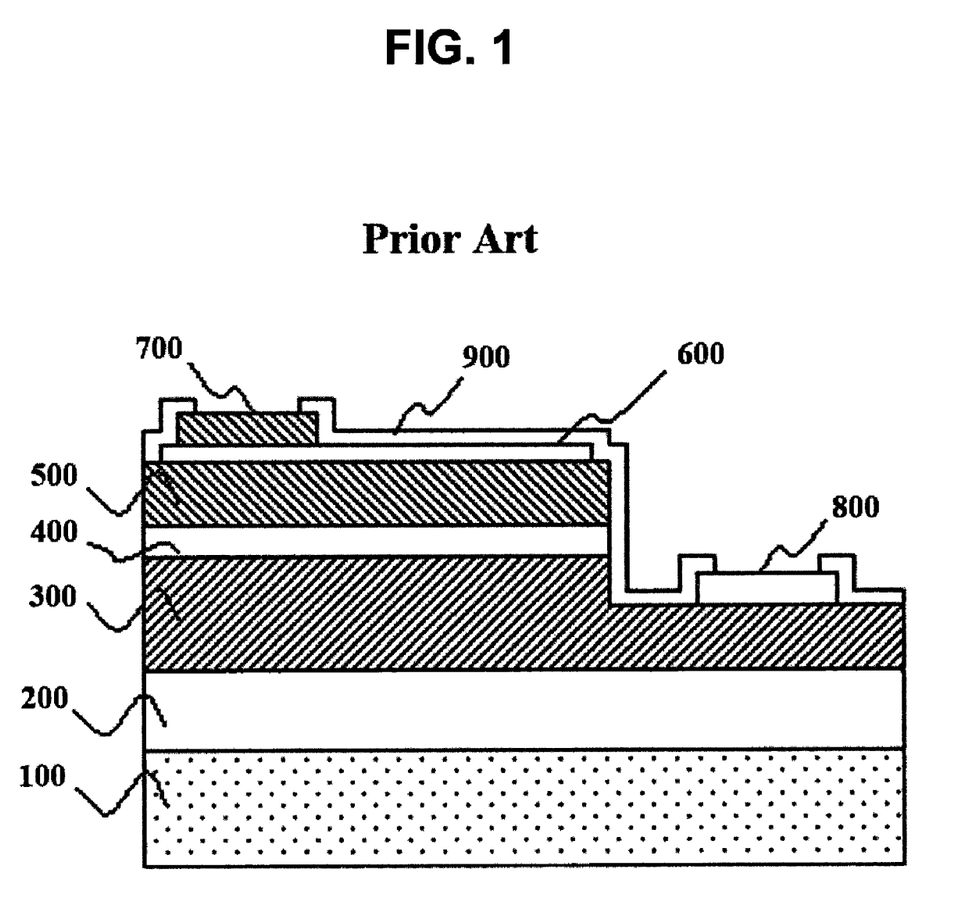
FIG. 1 is a view illustrating one example of a conventional III-nitride semiconductor light emitting device.

FIG. 1 is a view illustrating one example of a conventional III-nitride semiconductor light emitting device. The III-nitride semiconductor light emitting device includes a substrate 100, a buffer layer 200 epitaxially grown on the substrate 100, an n-type nitride semiconductor layer 300 epitaxially grown on the buffer layer 200, an active layer 400 epitaxially grown on the n-type nitride semiconductor layer 300, a p-type nitride semiconductor layer 500 epitaxially grown on the active layer 400, a p-side electrode 600 formed on the p-type nitride semiconductor layer 500, a p-side bonding pad 700 formed on the p-side electrode 600, an n-side electrode 800 formed on the n-type nitride semiconductor layer exposed by mesa-etching the p-type nitride semiconductor layer 500 and the active layer 400, and a protective film 900.

In the case of the substrate 100, a GaN substrate can be used as a homo-substrate, and a sapphire substrate, a SiC substrate or a Si substrate can be used as a hetero-substrate. However, any type of substrate that can grow a nitride semiconductor layer thereon can be employed. In the case that the SiC substrate is used, the n-side electrode 800 can be formed on the side of the SiC substrate.

The nitride semiconductor layers epitaxially grown on the substrate 100 are grown usually by metal organic chemical vapor deposition (MOCVD).

The buffer layer 200 serves to overcome differences in lattice constant and thermal expansion coefficient between the hetero-substrate 100 and the nitride semiconductor layers. U.S. Pat. No. 5,122,845 mentions a technique of growing an AlN buffer layer with a thickness of 100 to 500 Å on a sapphire substrate at 380 to 800° C. In addition, U.S. Pat. No. 5,290,393 mentions a technique of growing an $Al_{(x)}Ga_{(1-x)}N$ ($0 \leq x < 1$) buffer layer with a thickness of 10 to 5000 Å on a sapphire substrate at 200 to 900° C. Moreover, PCT Publication No. WO/05/053042 mentions a technique of growing a SiC buffer layer (seed layer) at 600 to 990° C., and growing an $In_{(x)}Ga_{(1-x)}N$ ($0 < x \leq 1$) thereon. Preferably, it is provided with an undoped GaN layer with a thickness of 1 to several μm on the AlN buffer layer, $Al_{(x)}Ga_{(1-x)}N$ ($0 \leq x < 1$) buffer layer or $SiC/In_{(x)}Ga_{(1-x)}N$ ($0 < x \leq 1$) layer.

In the n-type nitride semiconductor layer 300, at least the n-side electrode 800 formed region (n-type contact layer) is doped with a dopant. Preferably, the n-type contact layer is made of GaN and doped with Si. U.S. Pat. No. 5,733,796 mentions a technique of doping an n-type contact layer at a target doping concentration by adjusting the mixture ratio of Si and other source materials.

The active layer 400 generates light quanta (light) by recombination of electrons and holes. Normally, the active layer 400 contains $In_{(x)}Ga_{(1-x)}N$ ($0 < x \leq 1$) and has single or multi-quantum well layers. PCT Publication No. WO/02/021121 mentions a technique of doping some portions of a plurality of quantum well layers and barrier layers.

The p-type nitride semiconductor layer 500 is doped with an appropriate dopant such as Mg, and has p-type conductivity by an activation process. U.S. Pat. No. 5,247,533 mentions a technique of activating a p-type nitride semiconductor layer by electron beam irradiation. Moreover, U.S. Pat. No. 5,306,662 mentions a technique of activating a p-type nitride semiconductor layer by annealing over 400° C. PCT Publication No. WO/05/022655 mentions a technique of endowing a p-type nitride semiconductor layer with p-type conductivity without an activation process, by using ammonia and a hydrazine-based source material together as a nitrogen precursor for growing the p-type nitride semiconductor layer.

The p-side electrode 600 is provided to facilitate current supply to the p-type nitride semiconductor layer 500. U.S. Pat. No. 5,563,422 mentions a technique associated with a light transmitting electrode composed of Ni and Au and formed almost on the entire surface of the p-type nitride semiconductor layer 500 and in ohmic-contact with the p-type nitride semiconductor layer 500. In addition, U.S. Pat. No. 6,515,306 mentions a technique of forming an n-type superlattice layer on a p-type nitride semiconductor layer, and forming a light transmitting electrode made of ITO thereon.

Meanwhile, the light transmitting electrode 600 can be formed thick not to transmit but to reflect light toward the substrate 100. This technique is called a flip chip technique. U.S. Pat. No. 6,194,743 mentions a technique associated with an electrode structure including an Ag layer with a thickness over 20 nm, a diffusion barrier layer covering the Ag layer, and a bonding layer containing Au and Al, and covering the diffusion barrier layer.

The p-side bonding pad 700 and the n-side electrode 800 are provided for current supply and external wire bonding. U.S. Pat. No. 5,563,422 mentions a technique of forming an n-side electrode with Ti and Al.

The protection film 900 can be made of $SiO_2$, and may be omitted.

In the meantime, the n-type nitride semiconductor layer 300 or the p-type nitride semiconductor layer 500 can be constructed as single or plural layers. Recently, a technology of manufacturing vertical light emitting devices is introduced by separating the substrate 100 from the nitride semiconductor layers using laser technique or wet etching.

Figure 2:
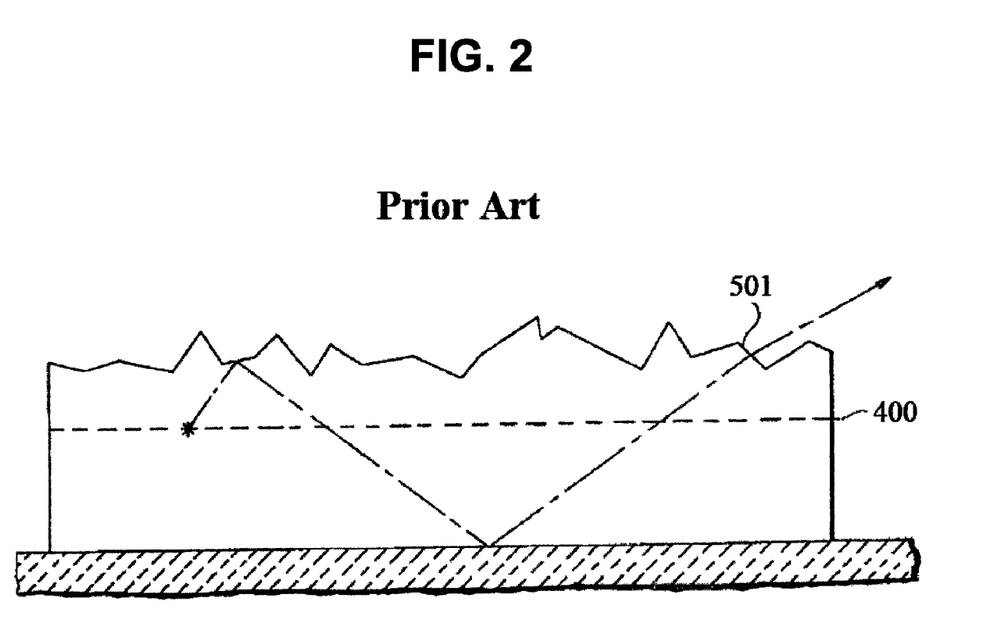
FIG. 2 is a view illustrating a light emitting device described in U.S. Pat. No. 3,739,217.

FIG. 2 is a view illustrating a light emitting device described in U.S. Pat. No. 3,739,217, particularly, a technology of improving external quantum efficiency by forming a rough surface 501 in a light emitting device by means of an etching, and scattering light generated from an active layer 400 through the rough surface 501.

Figure 3:
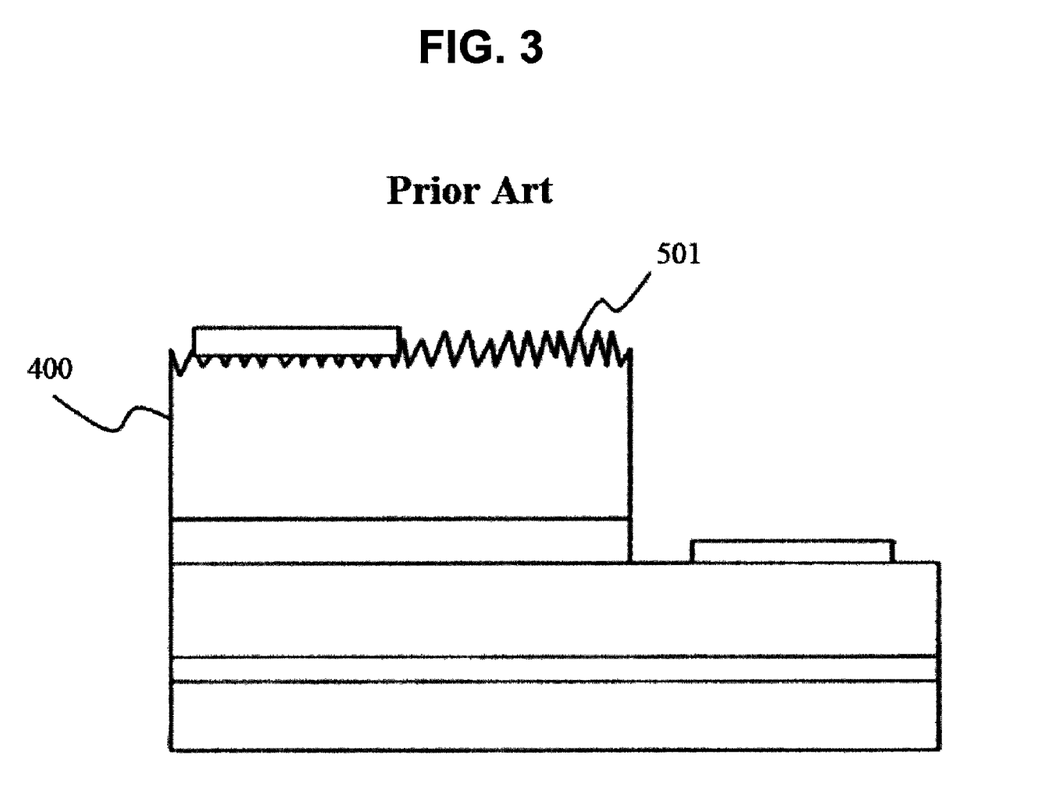
FIG. 3 is a view illustrating a light emitting device described in U.S. Pat. No. 6,441,403.

FIG. 3 is a view illustrating a light emitting device described in U.S. Pat. No. 6,441,403, particularly, a technology of forming a rough surface 501 on a p-type nitride semiconductor layer 500 by changing growth conditions (e.g., temperature, V/III ratio) in a growth process of the p-type nitride semiconductor layer 500 without requiring an additional process, pointing out problems occurring in the light emitting device when the rough surface 501 is formed by an etching (additional process, damage of the light emitting device by the etching, etc.). Here, the rough surface 501 can be formed by growing the p-type nitride semiconductor layer 500 at a lower temperature (e.g., 800° C.) than a normal growth temperature (e.g., 1000° C.) of the p-type nitride semiconductor layer 500.

SUMMARY

This section provides a general summary of the disclosure, and is not a comprehensive disclosure of its full scope or all of its features.

According to one aspect of the present disclosure, a III-nitride semiconductor light emitting device comprises an active layer for generating light by recombination of electrons and holes; an n-type nitride semiconductor layer positioned on one side of the active layer; and a p-type nitride semiconductor layer positioned on the other side of the active layer to be opposite to the n-type nitride semiconductor layer, and including a first nitride semiconductor layer with a first doping concentration, a second nitride semiconductor layer with a second doping concentration lower than the first doping concentration and with a rough surface, and a third nitride semiconductor layer with a higher doping concentration than a second doping concentration.

According to another aspect of the present disclosure, a III-nitride semiconductor light emitting device comprises an active layer for generating light by recombination of electrons and holes; an n-side electrode for supplying the electrons to the active layer; a p-side electrode for supplying the holes to the active layer; an n-type nitride semiconductor layer electrically contacting the n-side electrode; and a p-type nitride semiconductor layer electrically contacting the p-side electrode, and including a first nitride semiconductor layer with a first doping concentration, a second nitride semiconductor layer with a lower doping concentration than the first doping concentration and with a rough surface, and a third nitride semiconductor layer positioned between the second nitride semiconductor layer and the p-side electrode to lower a contact resistance between the p-side electrode and the p-type nitride semiconductor layer.

Further areas of applicability will become apparent from the description provided herein. The description and specific examples in this summary are intended for purposes of illustration only and are not intended to limit the scope of the present disclosure.

DESCRIPTION OF DRAWINGS

Corresponding reference numerals indicate corresponding parts throughout the several views of the drawings.

DETAILED DESCRIPTION

The present disclosure is to provide an III-nitride semiconductor light emitting device which improves external quantum efficiency.

In the present disclosure, there is provided a III-nitride semiconductor light emitting device, including: an active layer for generating light by recombination of electrons and holes; an n-type nitride semiconductor layer positioned on one side of the active layer; and a p-type nitride semiconductor layer positioned on the other side of the active layer to be opposite to the n-type nitride semiconductor layer, and including a first nitride semiconductor layer with a first doping concentration, a second nitride semiconductor layer with a second doping concentration lower than the first doping concentration and with a rough surface, and a third nitride semiconductor layer with a higher doping concentration than a second doping concentration. It is preferable that the second nitride semiconductor layer is undoped in consideration of the roughness. However, since a forward voltage of the light emitting device must be satisfied depending on a required use of a product, the second nitride semiconductor layer can be doped at a low level according to a required value of the forward voltage.

In another aspect of the present disclosure, the first nitride semiconductor layer is positioned with respect to the active layer so as to prevent electrons from being transferred from the active layer. Preferably, the first nitride semiconductor layer is positioned in contact with the active layer, and the active layer mostly has a multi-quantum well structure.

In another aspect of the present disclosure, the third nitride semiconductor layer covers the second nitride semiconductor layer, maintaining the contour of the rough surface. In a case where the third nitride semiconductor layer is configured as a superlattice layer containing AlGaN or InGaN, refractive index differences between the layers can be used, so the restriction for maintaining the contour can be made reduced more or less.

In another aspect of the present disclosure, the III-nitride semiconductor light emitting device includes a p-side electrode electrically contacting the third nitride semiconductor layer.

In another aspect of the present disclosure, the first nitride semiconductor layer is grown at a first growth temperature, the second nitride semiconductor layer is grown at a second growth temperature, and the third nitride semiconductor layer is grown at a third growth temperature, the second nitride semiconductor layer being grown at a lower temperature than the first temperature and the third temperature to have the rough surface.

In another aspect of the present disclosure, the first nitride semiconductor layer has a first thickness, the second nitride semiconductor layer has a second thickness, and the third nitride semiconductor layer has a third thickness, the second thickness being larger than the first thickness and the third thickness.

In another aspect of the present disclosure, there is provided a III-nitride semiconductor light emitting device, including: an active layer for generating light by recombination of electrons and holes; an n-side electrode for supplying the electrons to the active layer; a p-side electrode for supplying the holes to the active layer; an n-type nitride semiconductor layer electrically contacting the n-side electrode; and a p-type nitride semiconductor layer electrically contacting the p-side electrode, and including a first nitride semiconductor layer with a first doping concentration, a second nitride semiconductor layer with a lower doping concentration than the first doping concentration and with a rough surface, and a third nitride semiconductor layer positioned between the second nitride semiconductor layer and the p-side electrode to lower a contact resistance between the p-side electrode and the p-type nitride semiconductor layer. Preferably, the third nitride semiconductor layer is configured as the p-type nitride semiconductor layer, but may be configured as the n-type nitride semiconductor layer to supply the holes to the active layer by tunneling. It is useful when a material such as ITO is used as the p-side electrode. As described above, the third nitride semiconductor layer can be multilayered like a superlattice structure.

According to the present disclosure, the III-nitride semiconductor light emitting device can improve external quantum efficiency by emitting light generated from the active layer to the outside of the light emitting device, by using the new p-type nitride semiconductor layer with the rough surface.

Example embodiments will now be described more fully with reference to the accompanying drawings.

Figure 4:
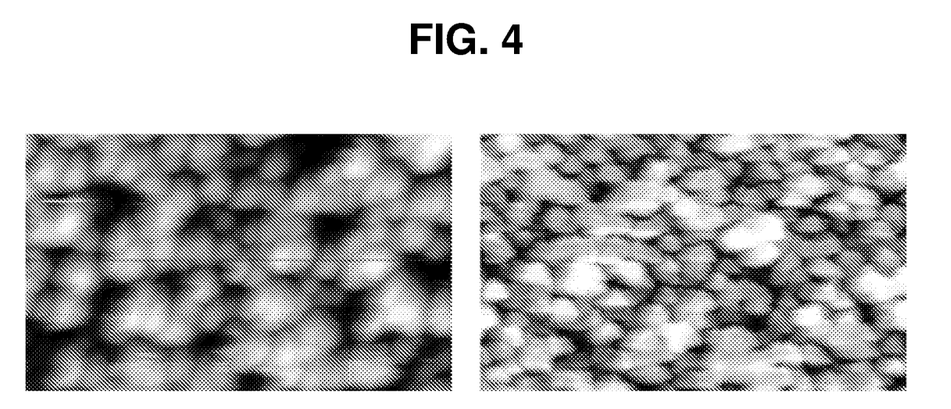
FIG. 4 is a view illustrating one example of an experiment result according to one embodiment of the present disclosure.

FIG. 4 is a view illustrating one example of an experiment result according to the present disclosure, particularly, rough surfaces formed according to input of Mg which is a p-type dopant during the growth of a nitride semiconductor layer. According to this experiment, when an input amount of Mg was small, the roughness was high (right side view), and when an input amount of Mg was large, the roughness was low (left side view). It is judged that an Mg source (e.g., $CP_2Mg$) facilitates the horizontal growth to reduce the roughness.

The nitride semiconductor layer was grown at a pressure below 500 torr, a temperature of about 780° C. and a growth speed of 5.5 A/sec., by supplying 220 µmol/min. of TMGa and 2800 V/III ratio of $NH_3$ for 1200 seconds. The experiment was conducted to compare a case using 900 cc of $CP_2Mg$ with a case using 0 cc of $CP_2Mg$.

Accordingly, it is advantageous that Mg is not input in consideration of the roughness of a p-type nitride semiconductor layer. However, since the p-type nitride semiconductor layer serves to supply holes to an active layer, if only the p-type nitride semiconductor layer with a low doping concentration is used, it excessively increases a forward voltage Vf of a light emitting device, so that the light emitting device cannot normally operate. Considering the aforementioned aspects, the present disclosure suggests a novel III-nitride semiconductor light emitting device with a rough surface formed during the growth.

Figure 5:
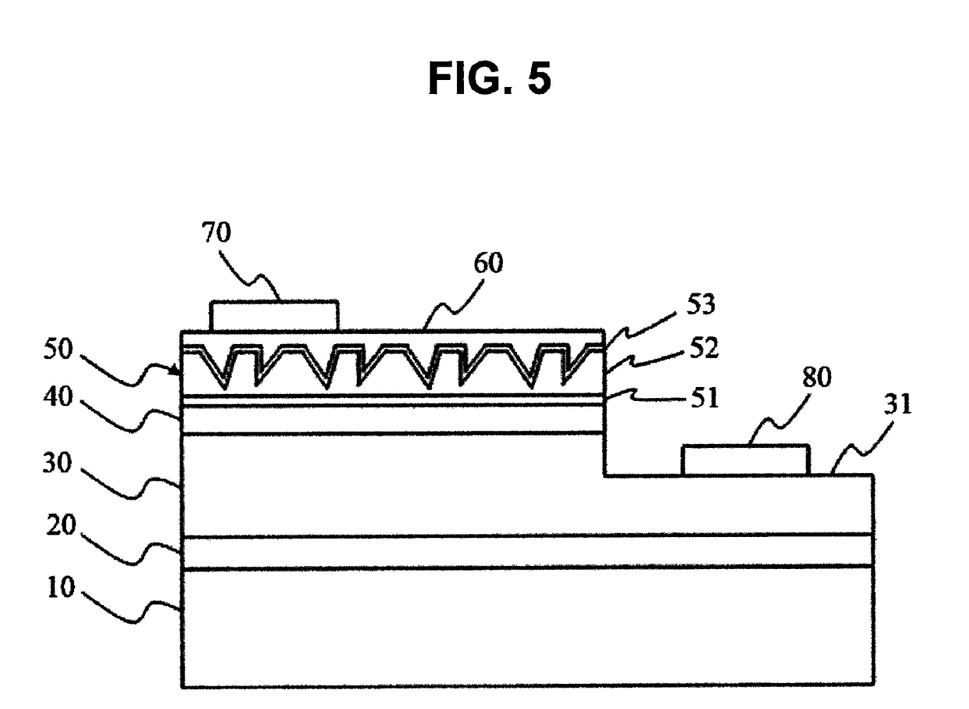
FIG. 5 is a view illustrating a III-nitride semiconductor light emitting device according to another embodiment of the present disclosure.

FIG. 5 is a view illustrating a III-nitride semiconductor light emitting device according to the present disclosure. The III-nitride semiconductor light emitting device includes a sapphire substrate 10, a buffer layer 20 grown on the sapphire substrate 10, an n-type nitride semiconductor layer 30 grown on the buffer layer 20, an active layer 40 grown on the n-type nitride semiconductor layer 30, a p-type nitride semiconductor layer 50 grown on the active layer 40, a p-side electrode 60 formed on the p-type nitride semiconductor layer 50, a p-side bonding pad 70 formed on the p-side electrode 60, and an n-side electrode 80 formed on an n-type nitride semiconductor layer 31 exposed by mesa-etching the p-type nitride semiconductor layer 50 and the active layer 40.

The p-type nitride semiconductor layer 50 includes a first nitride semiconductor layer 51, a second nitride semiconductor layer 52 with a rough surface, and a third nitride semiconductor layer 53. Since the second nitride semiconductor layer 52 is doped at a low doping concentration or is not doped, it cannot supply sufficient holes to the active layer 40, and cannot form a sufficient barrier to confine electrons supplied to the active layer 40 through the n-side electrode 80 within the active layer 40. In order to solve the foregoing problem, the first nitride semiconductor layer 51 with a higher doping concentration than that of the second nitride semiconductor layer 52 is provided between the active layer 40 and the second nitride semiconductor layer 52. The first nitride semiconductor layer 51 not only increases the entire doping concentration of the p-type nitride semiconductor layer 50 to smoothly supply holes to the active layer 40, but also prevents electrons from being transferred from the active layer 40 to the p-type nitride semiconductor layer 50. Meanwhile, in the relation with the p-side electrode 60, the second nitride semiconductor layer 52 raises a contact resistance to the p-side electrode 60 due to a low doping concentration. So as to solve this problem, the third nitride semiconductor layer 53 with a higher doping concentration than that of the second nitride semiconductor layer 52 is formed along the rough surface of the second nitride semiconductor layer 52. It is thus possible to lower a contact resistance between the p-type nitride semiconductor layer 50 and the p-side electrode 60. The first nitride semiconductor layer 51 can be formed of Mg-doped GaN with a thickness of 500 Å at a temperature of about 950° C. If the first nitride semiconductor layer 51 grown at a high temperature is doped with Mg at a high concentration, it may affect a characteristic of the active layer 40. Therefore, preferably, the first nitride semiconductor layer 51 has a thickness of 200 to 700 Å.

The second nitride semiconductor layer 52 can be formed of Mg-doped GaN with a thickness of 7000 Å at a temperature of about 800° C. The second nitride semiconductor layer 52 can be grown to have a rough surface at a temperature below 1000° C. by adjusting various parameters. However, in a case where the second nitride semiconductor layer 52 is grown at a temperature below 600° C., N is not sufficiently supplied from $NH_3$. Here, a hydrazine-based source having an excellent thermal decomposition rate at a low temperature can be used therewith as an N supply source. The second nitride semiconductor layer 52 should be sufficiently thick to accommodate the rough surface. In a case where the second nitride semiconductor layer 52 is formed as a p-type, it is not easily formed thick due to a characteristic of p-type GaN. In a case where the second nitride semiconductor layer 52 is formed of undoped GaN, a forward voltage should be considered. There is no special limitation on the thickness of the second nitride semiconductor layer 52. Considering the aforementioned facts, the thickness of the second nitride semiconductor layer 52 preferably ranges from 5000 Å to 8000 Å.

The third nitride semiconductor layer 53 can be formed of Mg-doped GaN with a thickness of 300 Å at a temperature of about 950° C. In a case where the third nitride semiconductor layer 53 is formed of the same material as that of the second nitride semiconductor layer 52, if the third nitride semiconductor layer 53 fills up the rough surface, the rough surface does not normally function. Accordingly, the third nitride semiconductor layer 53 is formed to cover the rough surface along the rough surface. That is, preferably, the third nitride semiconductor layer 53 has a thickness of 200 to 500 Å.

Figure 6:
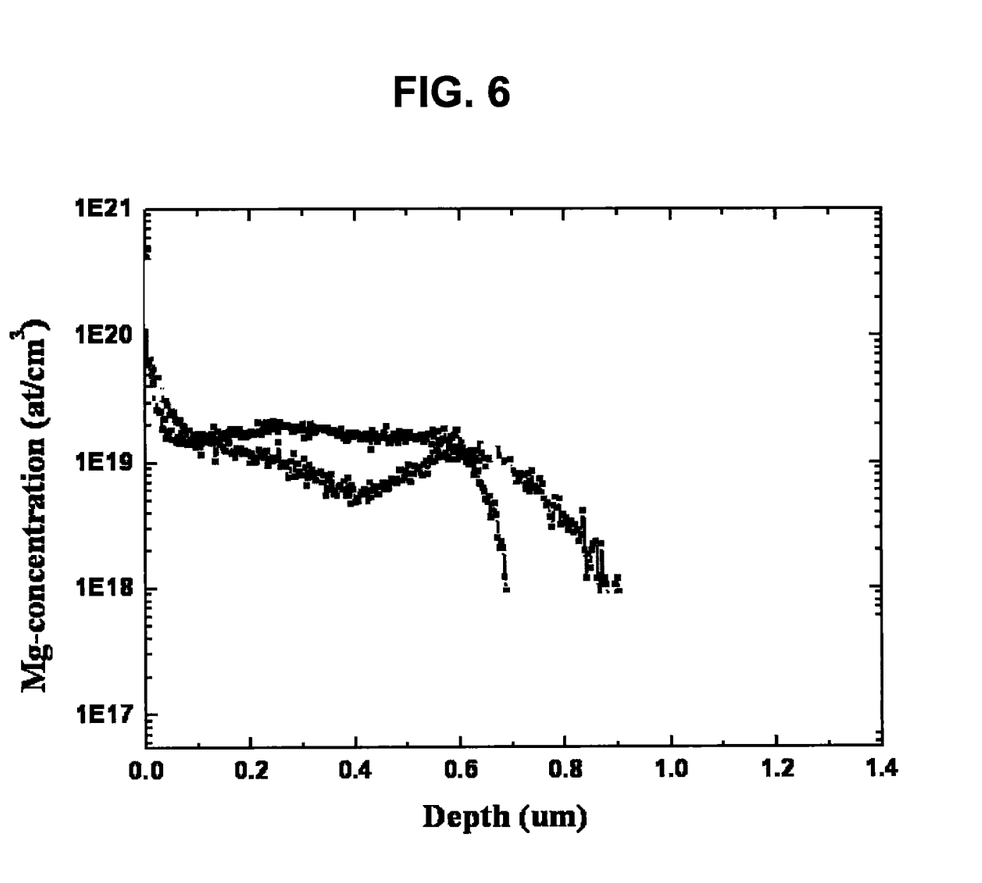
FIG. 6 is a view illustrating example of a doping profile of a p-type nitride semiconductor layer according to another embodiment of the present disclosure.

FIG. 6 is a view illustrating example of a doping profile of a p-type nitride semiconductor layer according to the present disclosure. A less deep part corresponds to the third nitride semiconductor layer, a middle part (about to 0.6 μm to 0.7 μm) corresponds to the second nitride semiconductor layer, and a rear part corresponds to the first nitride semiconductor layer. A light color profile indicates a case where the second nitride semiconductor layer was undoped, in comparison with a case where the second nitride semiconductor layer was doped, indicated by a deep color profile.

Figure 7:
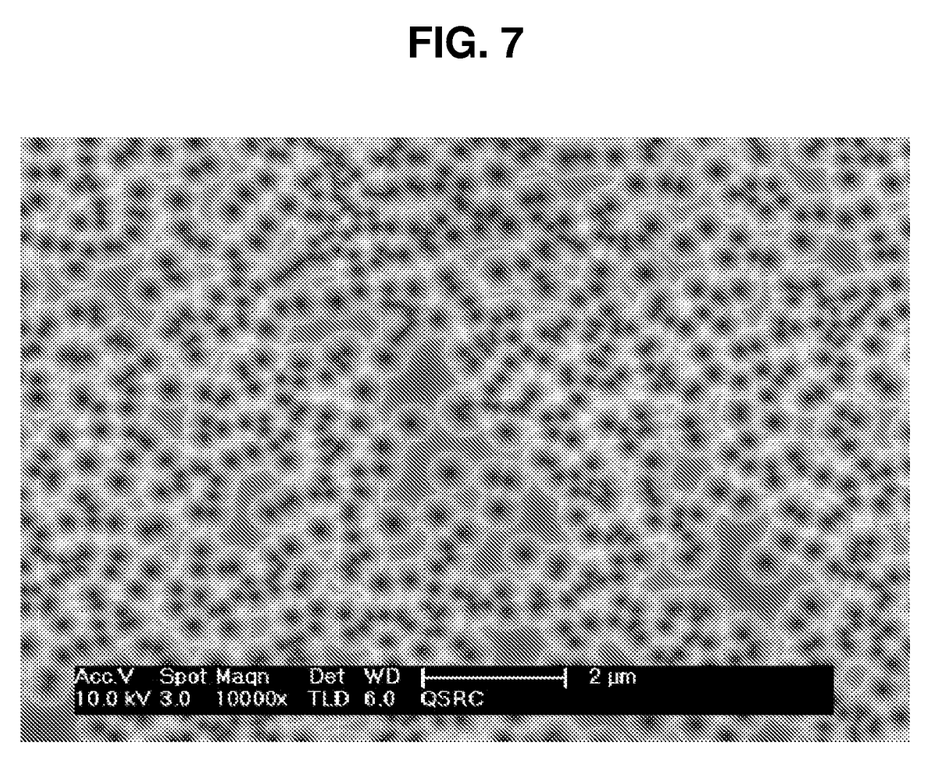
FIG. 7 is a view illustrating one example of a surface of a p-type nitride semiconductor layer grown according to another embodiment of the present disclosure.

FIG. 7 is a view illustrating one example of a surface of a p-type nitride semiconductor layer grown according to the present disclosure. Hexagonal pits were formed at a high density. If growth conditions are changed to increase the roughness, the surface may be formed with protrusions.

Figure 8:
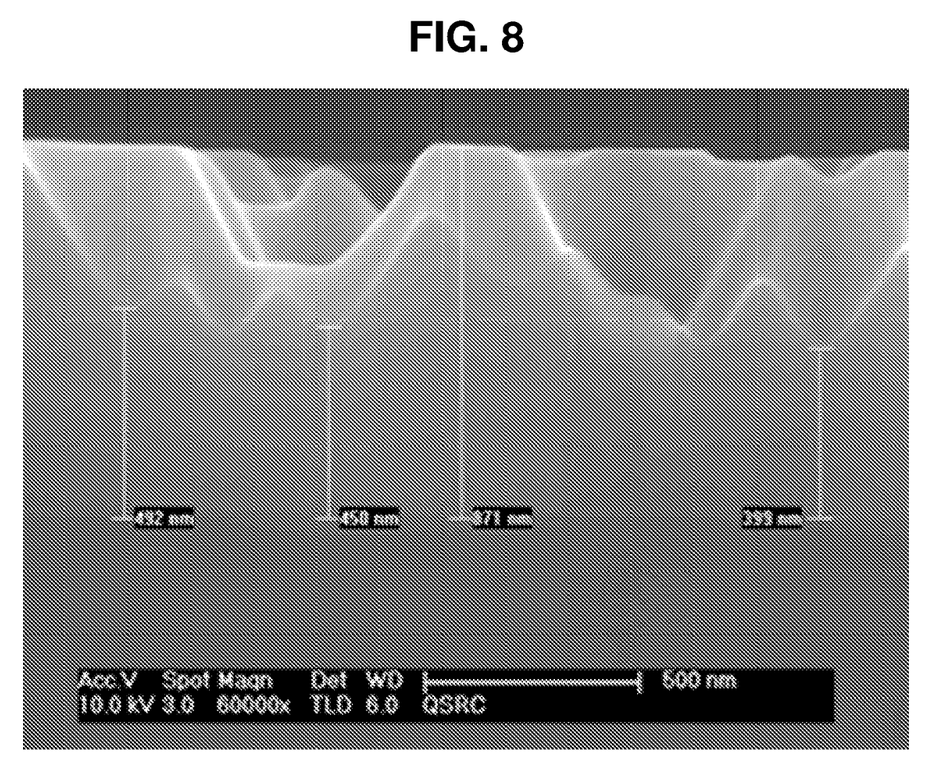
FIG. 8 is a view illustrating one example of a section of a p-type nitride semiconductor layer grown according to another embodiment of the present disclosure.

FIG. 8 is a view illustrating one example of a section of a p-type nitride semiconductor layer grown according to the present disclosure. When an entire thickness of a second nitride semiconductor layer 52 was about 871 nm, depressed portions with a depth of 300 nm to 500 nm were formed to define a rough surface.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

What is claimed:

1. A III-nitride semiconductor light emitting device, comprising:
   an active layer for generating light by recombination of electrons and holes;
   an n-type nitride semiconductor layer positioned on one side of the active layer; and
   a p-type nitride semiconductor layer positioned on the other side of the active layer to be opposite to the n-type nitride semiconductor layer, and including a first nitride semiconductor layer with a first doping concentration, a second nitride semiconductor layer with a second doping concentration lower than the first doping concentration and with a rough surface, and a third nitride semiconductor layer with a higher doping concentration than a second doping concentration.

2. The III-nitride semiconductor light emitting device of claim 1, wherein the first nitride semiconductor layer is positioned with respect to the active layer so as to prevent electrons from being transferred from the active layer.

3. The III-nitride semiconductor light emitting device of claim 1, wherein the third nitride semiconductor layer covers the second nitride semiconductor layer, maintaining the contour of the rough surface.

4. The III-nitride semiconductor light emitting device of claim 1, comprising a p-side electrode electrically contacting the third nitride semiconductor layer.

5. The III-nitride semiconductor light emitting device of claim 1, wherein the first nitride semiconductor layer is grown at a first growth temperature, the second nitride semiconductor layer is grown at a second growth temperature, and the third nitride semiconductor layer is grown at a third growth temperature, the second nitride semiconductor layer being grown at a lower temperature than the first temperature and the third temperature to have the rough surface.

6. The III-nitride semiconductor light emitting device of claim 1, wherein the first nitride semiconductor layer has a first thickness, the second nitride semiconductor layer has a second thickness, and the third nitride semiconductor layer has a third thickness, the second thickness being larger than the first thickness and the third thickness.

7. The III-nitride semiconductor light emitting device of claim 1, wherein the first nitride semiconductor layer is positioned with respect to the active layer so as to prevent electrons from being transferred from the active layer, the third nitride semiconductor layer covers the second nitride semiconductor layer, maintaining the contour of the rough surface, the first nitride semiconductor layer has a first thickness, the second nitride semiconductor layer has a second thickness, and the third nitride semiconductor layer has a third thickness, the second thickness being larger than the first thickness and the third thickness.

8. The III-nitride semiconductor light emitting device of claim 7, comprising a p-side electrode for covering the third nitride semiconductor layer.

9. The III-nitride semiconductor light emitting device of claim 1, wherein a dopant of the p-type nitride semiconductor layer is Mg.

10. The III-nitride semiconductor light emitting device of claim 1, wherein the second nitride semiconductor layer is undoped.

11. A III-nitride semiconductor light emitting device, comprising:
    an active layer for generating light by recombination of electrons and holes;
    an n-side electrode for supplying the electrons to the active layer;
    a p-side electrode for supplying the holes to the active layer;
    an n-type nitride semiconductor layer electrically contacting the n-side electrode; and a p-type nitride semiconductor layer electrically contacting the p-side electrode, and including a first nitride semiconductor layer with a first doping concentration, a second nitride semiconductor layer with a lower doping concentration than the first doping concentration and with a rough surface, and a third nitride semiconductor layer positioned between the second nitride semiconductor layer and the p-side electrode to lower a contact resistance between the p-side electrode and the p-type nitride semiconductor layer.

* * * * *